United States Patent [19]

Miller

[11] 4,413,230

[45] Nov. 1, 1983

[54] ELECTRIC ENERGY METER HAVING A MUTUAL INDUCTANCE CURRENT TRANSDUCER

[75] Inventor: Robert C. Miller, Pittsburgh, Pa.

[73] Assignee: Westinghouse Electric Corp., Pittsburgh, Pa.

[21] Appl. No.: 360,738

[22] Filed: Mar. 20, 1982

Related U.S. Application Data

[63] Continuation of Ser. No. 121,070, Feb. 13, 1980, abandoned, and a continuation-in-part of Ser. No. 13,938, Feb. 22, 1979, abandoned, which is a continuation-in-part of Ser. No. 923,619, Jul. 11, 1978, abandoned.

[51] Int. Cl.³ .................. G01R 11/48; G01R 1/20
[52] U.S. Cl. .................. 324/142; 324/107; 324/127
[58] Field of Search .............. 324/142, 107, 127, 132, 324/141; 336/155; 364/483

[56] References Cited

U.S. PATENT DOCUMENTS

| | | | |
|---|---|---|---|
| 3,226,641 | 12/1965 | Miller | 364/483 |
| 3,343,084 | 9/1967 | Gambale et al. | 324/142 |
| 3,519,933 | 7/1970 | Lopez | 324/142 |
| 3,764,908 | 10/1973 | Elms | 324/142 |
| 3,864,631 | 2/1975 | Zitelli et al. | 324/142 |
| 3,934,198 | 1/1976 | Milkovic | 324/142 |

FOREIGN PATENT DOCUMENTS

| | | |
|---|---|---|
| 2409990 | 9/1975 | Fed. Rep. of Germany ...... 324/127 |
| 832520 | 4/1960 | United Kingdom . |
| 1231108 | 5/1971 | United Kingdom . |
| 1268229 | 3/1972 | United Kingdom . |
| 1330584 | 9/1973 | United Kingdom . |
| 1477207 | 6/1977 | United Kingdom . |
| 1519787 | 8/1978 | United Kingdom . |

*Primary Examiner*—Ernest F. Karlsen
*Attorney, Agent, or Firm*—Robert E. Converse, Jr.

[57] ABSTRACT

An electric energy meter includes a mutual inductance current transducer formed by primary winding means for direct connection to the current component of an electric energy quantity to be measured. Secondary winding means is inductively coupled to the primary winding means to produce an analog signal that is proportional to the time derivative of the current component. The current responsive analog signal and a voltage responsive analog signal are both applied to an electronic watthour measuring circuit.

14 Claims, 9 Drawing Figures

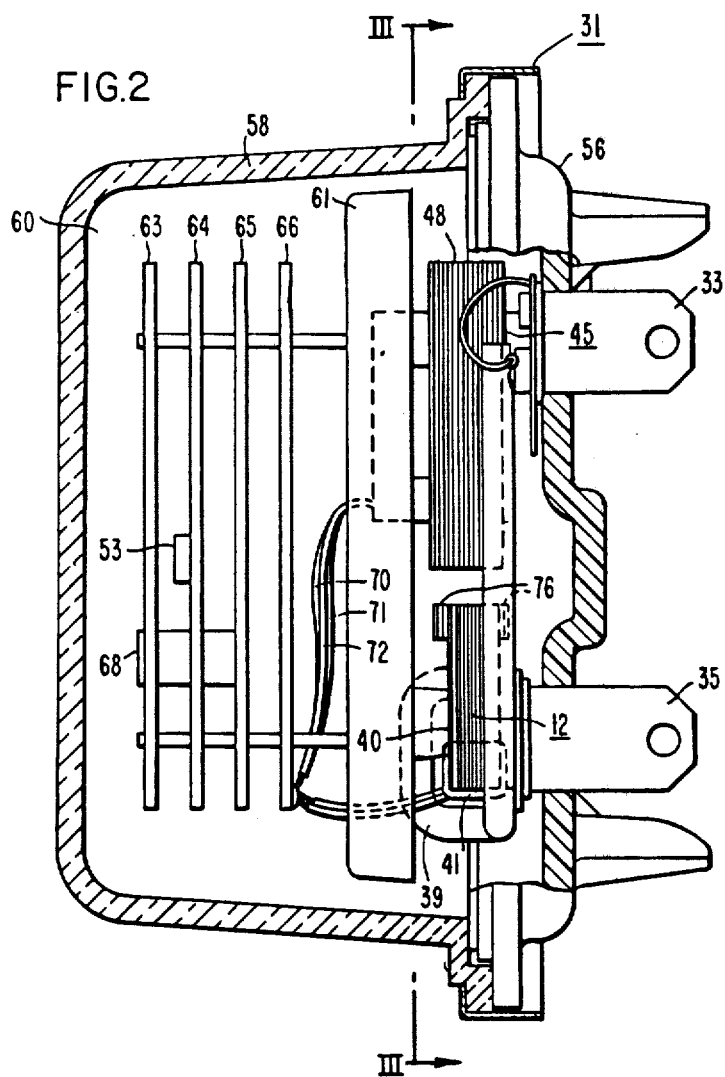

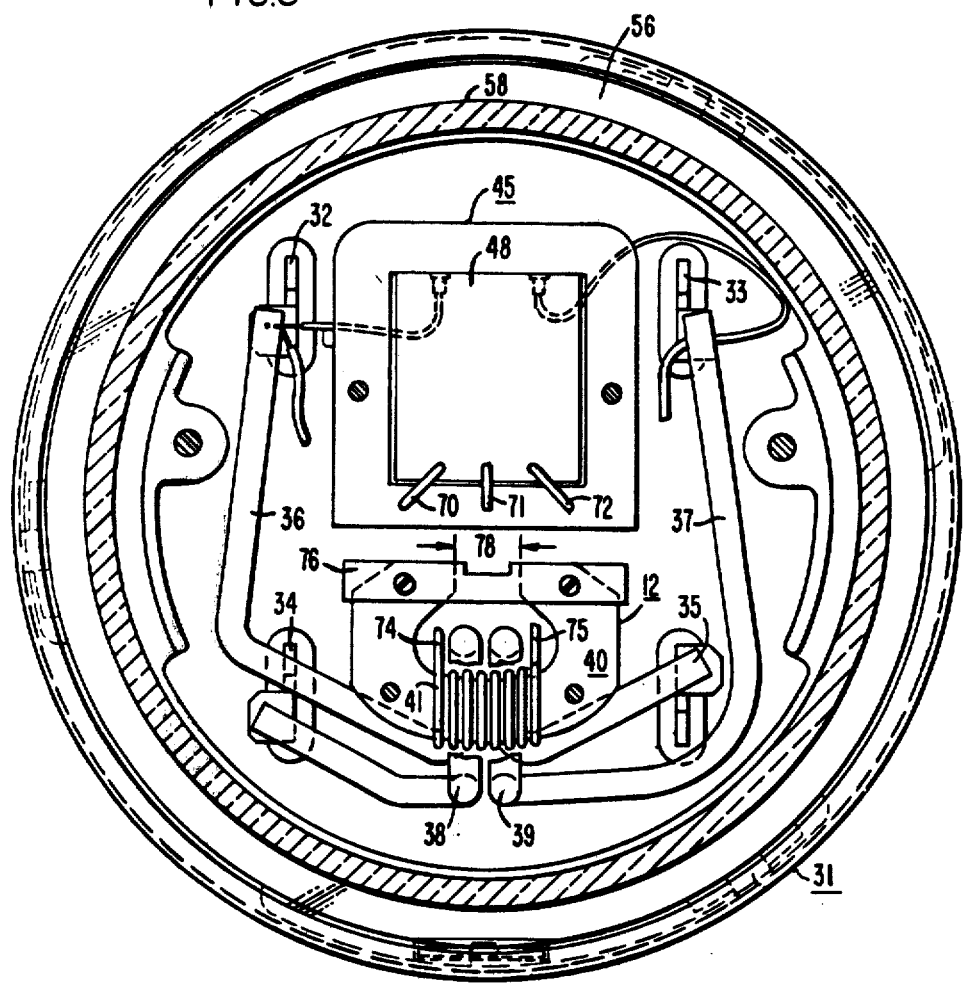

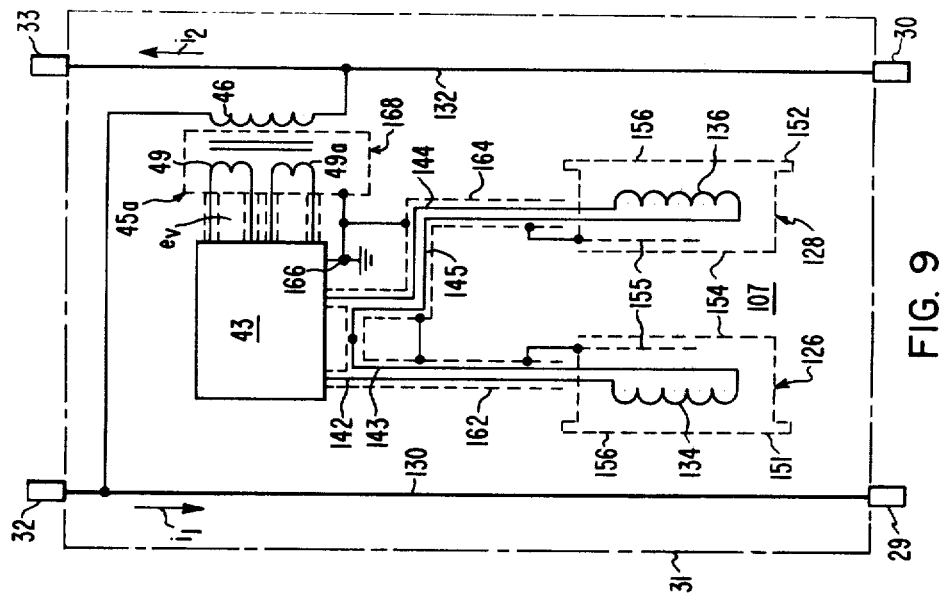
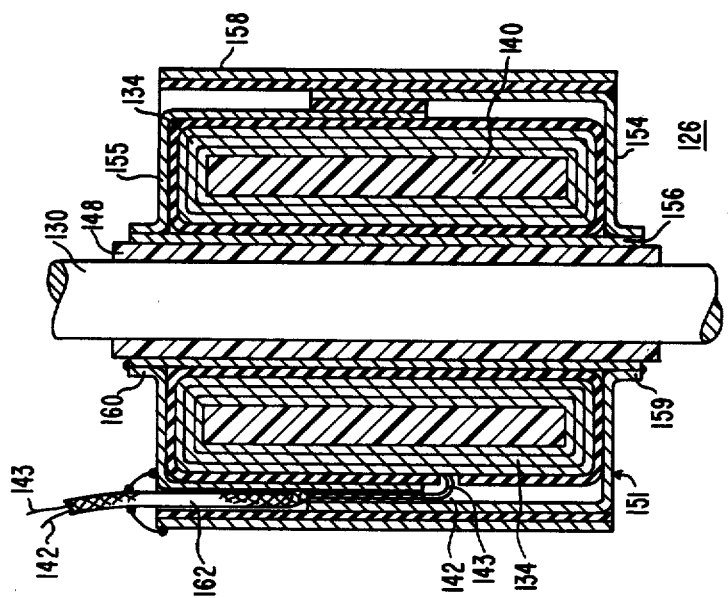
FIG. 9
FIG. 8

ELECTRIC ENERGY METER HAVING A MUTUAL INDUCTANCE CURRENT TRANSDUCER

CROSS REFERENCE TO RELATED APPLICATION

This is a continuation of application Ser. No. 121,070, filed Feb. 13, 1980, now abandoned, and a continuation-in-part of application Ser. No. 013,938, filed Feb. 22, 1979, now abandoned, which is a continuation-in-part of application Ser. No. 923,619, filed July 11, 1978, now abandoned, and assigned to the assignee of this invention.

BACKGROUND OF THE INVENTION

1. Field of the Invention

This invention relates to AC electric energy meters including voltage and current sensing transducers for applying signals responsive to the current and voltage components of an electric energy quantity to be measured by electronic measuring circuits, and more particularly to such meters including a mutual inductance current sensing transducer capable of sensing widely varying values of the current component with both transducers producing low level output signals suitable for use by the electronic measuring circuits.

2. Description of the Prior Art

Devices for AC electric energy measurement are extensively used by producers of electric energy for measuring consumption by separate energy users. Typically, watthour meters are used for indicating consumption in kilowatt-hours. The watthour meters are usually of the induction type having a rotating disc, which are recognized as having high degrees of reliability and accuracy being available at reasonable costs, and being capable of outdoor operation under widely varying extremes of temperature and other ambient conditions.

It is also known to measure AC electric energy quantities such as kilowatt-hours, volt-ampere hours, reactive volt-ampere hours, with electronic measuring circuits. Typically, voltage and current instrument transformers provide signals proportional to the voltage and current components of an electric energy quantity to be measured. Analog multiplier circuit arrangements are known in one type of measuring circuit and they are arranged to produce a signal proportional to the time integral of the product of the voltage and current components. One electronic measuring circuit is described in U.S. Pat. No. 3,764,908, assigned to the assignee of this invention, wherein voltage and current signals are applied to a semiconductor device having a logarithmic computing characteristic. An output signal is produced therefrom which is proportional to the product of the voltage and current signals and a measured value of the electric power quantity.

Another known analog multiplier type of AC electric energy measuring circuitry is referred to as a time-division-multiplication type of measuring circuit. In U.S. Pat. No. 3,864,631, assigned to the assignee of this invention, the technique of analog multiplication is disclosed. A voltage component signal is sampled to derive a variable pulse width modulated signal corresponding to the voltage component variations. A current component signal is sampled at a rate responsive to the variable pulse width signals. A resultant output is produced, consisting of a series of pulses having amplitudes proportional to the instantaneous current values and pulse widths proportional to the instantaneous voltage values. The resultant pulse signals are filtered to obtain an average value, or DC level, proportional to measured AC electric power. The average value signal controls a voltage-to-frequency conversion circuit, utilizing integrating capacitors. Variable frequency pulses from the conversion circuit are totalized, so that a total pulse count is a measure of the electric energy consumption.

In U.S. Pat. No. 3,343,084, assigned to the assignee of the present invention, voltage and current components of an electric energy quantity to be measured are applied to a Hall generator. The output of the Hall generator provides a signal proportional to the product of the voltage and current signal inputs. The Hall generator output is applied to a saturable core transformer integrating device to produce pulses which are proportional to the time integral of the Hall generator output or of the electric energy to be measured. The voltage and current inputs to the Hall generator are applied from the detachable contact terminals of a detachable watthour meter.

In U.S. patent application Ser. No. 919,874 filed June 26, 1978, and assigned to the assignee of this invention, an AC electric energy measuring circuit and method is described wherein the voltage component of an electric energy quantity to be measured is converted by electric circuit techniques to a signal proportional to the time integral of the voltage component. The time integral voltage signal is compared to incremental reference levels. Each instance that a referenced level is reached, the instantaneous magnitude of the current component is sampled and converted to digital signals. These digital signals are summed to produce an output signal corresponding to a measure of AC electric energy in watthours. Some of the component drift disadvantages of prior analog multiplier circuits are avoided by the aforementioned circuit.

A further example of an electric energy measuring circuit is disclosed in U.S. Pat. No. 4,077,061, assigned to the assignee of this invention, where analog-to-digital sampling of the voltage and current components is performed for subsequent digital processing and calculation. A number of different electric energy parameters are calculated by digital computational circuit techniques.

In each of the aforementioned circuit techniques for electric energy measurements, the voltage and current inputs to the AC energy measuring circuit are provided directly by the line voltage and current or by instrument transformers for producing signals proportional to the line voltage and current components of the electric energy quantity being measured. Although electronic circuits are operable in small signal ranges, the electric power voltage and currents are several magnitudes larger. Thus, the sensing transducers which provide the voltage and current responsive inputs to the measuring circuits must have large transformation ratios. Also, the sensing transducer's response must be linear with the proportionalities between the input and output being constant. In the case of the current transducer, the linear response must be over a wide range of current values to be sensed.

In U.S. Pat. No. 3,226,641 an electronic watt measuring circuit is described having a single air core current transformer having a multiple turn primary for producing an output signal proportional to the load current. The output signal is applied to an integrating circuit including an operational amplifier so that the current transformer network provides a voltage signal proportional and in phase with the sensed load current to be applied to an electronic quarter square multiplying circuit.

In typical electric energy measurements at a utility customer location, sixty Hertz AC electric power is delivered at substantially constant line voltages of either 120 or 240 volts defining the voltage components of the electric energy quantity to be measured. On the other hand, currents which define the current component of the electric energy quantity to be measured vary considerably in response to load changes. In measuring for billing purposes, a substantially linear response is desired in a general range of from one-half ampere to 200 amperes, or in a current variation ratio of approximately four hundred to one. With line current values above 200 amperes and below one-half ampere degradation of the linear response begins to occur in many systems. Accordingly, standard potential transformer arrangements can provide practical voltage sensing transducers. However, current transformers receiving the aforementioned substantially wide input variations, with a ratio in the order of four hundred to one, and producing low level signal outputs require arrangements which are often of substantial size and cost. When it is desired to manufacture electronic AC energy measuring circuits and devices which are relatively compact and comparable in cost to the aforementioned conventional induction type watthour meters, the voltage and current sensing transducers present substantial contributions to the overall size and cost of such device. As is known in accurate current transformer transducers, the ampere turns of the primary and of the secondary must be equal, and since current levels can produce 400 ampere-turns in the primary, the secondary winding sizes become substantial in order to produce linear low level signal outputs resulting in current transformers that are bulky and are relatively costly.

Accordingly, it is desirable to provide the voltage and current sensing transducers for electronic AC energy measuring circuits which are highly reliable and accurate and are adapted for standard connection to the conductors supplying the electric energy to be measured, such as supplied by service entrance conductors of a residential electric power user's location. It is further desirable that the current sensing transducer of such devices be compact, capable of mass production by economical manufacturing techniques and be operable to produce low level signal outputs accurately in response to large variations of load currents to be sensed.

SUMMARY OF THE INVENTION

In accordance with the present invention, an electronic watthour meter circuit includes a mutual inductance current sensing transducer having secondary winding means inductively coupled to primary winding means carrying a current component of the electrical energy to be measured. The transducer is responsive to wide ratios of current variation and has the secondary output producing analog signals for AC electric energy measurement that are proportional to the time derivative of the current. One preferred embodiment of the transducer is formed by a laminated, magnetically permeable core, having an air gap space included in the path of the magnetic flux linking the primary and secondary windings. Large current carrying conductors each define a single turn primary winding positioned in close inductively coupled relationship with the core. Magnetic flux is induced into the core and through the air gap by the flow of current to be sensed in the large conductors. A secondary winding is positioned in close inductive relationship to the core to produce an induced voltage $e_i = M \, di/dt$, where M is the mutual inductance between the primary and secondary circuits and $di/dt$ is the time derivative of the primary current. In accordance with the above equation, the secondary signal $e_i$ is a representation of the time derivative of the primary current when the primary and secondary windings are mutually coupled with or without a magnetic core. It is an important characteristic that substantially very low current flows in the secondary winding when connected to high impedance electronic circuits. Thus, the induced voltage signal $e_i$ represents the time derivative of the line current component of the electric energy quantity to be measured and is effective to provide the current responsive analog input signal to an electronic AC energy measuring circuit also receiving a voltage responsive analog input signal $e_v$. The signal $e_i$ is processed in the AC energy measuring circuit along with the signal $e_v$, representing the line voltage component of the energy to be measured, to produce a signal representative of alternating current energy consumption. The circuit derives the time integral of the product of the voltage and current components of an electrical energy quantity over a predetermined time interval to provide energy measurement in watthours.

The use of a magnetic core increases the inductive couplings between the primary and secondary windings in one form of the invention but non-linear magnetic characteristics of the core can result in a given change in current not producing a precisely proportional change in the flux in the magnetic material of the coil. A compensation arrangement is provided in one embodiment by laminated shunt bars bridging the core air gap space. The compensating shunt bars saturate at high flux densities to compensate for non-linearities at low flux densities in the core which are at least partially due to the non-linear change of permeability with magnetic induction in the magnetic material forming the core. Thus, more linear response of the output signal $e_i$ is produced at the lower current values being sensed. The non-linear response effects of the magnetic core materials is further minimized by large air gap spacings and use of materials having high initial permeability $\mu_o$.

A further compensation arrangement includes a compensating flux pick-up coil positioned adjacent the air gap. Fringe or stray flux densities at the air gap provide proportionately greater flux densities at low flux values than at higher flux values. The outputs of the compensating pick-up coil and of the secondary winding are both applied to a summing amplifier. The summing amplifier output provides an induced voltage $e_i$ proportional to the time derivative of the primary current ($di/dt$) which is more linearly responsive to low flux densities in the core. The compensation arrangements may not completely accomplish constant linear magnetic response; however, further compensation in the electric energy measuring circuits is possible by modification thereof so that opposite response characteristics in the measuring circuits to the transducer non-linear output characteristics can result in an overall linear output in response to the transducer input current.

One form of the present invention includes parts of an induction watthour meter including modified forms of the voltage electromagnet section and the current electromagnet section utilizing the same voltage and current windings and associated magnetic cores as when used for magnetically rotating a disc for electromechanical operation. A secondary winding is included in the voltage section to provide a line voltage responsive analog signal $e_v$ proportional to the voltage component of an electric energy quantity. A secondary winding is provided on the watthour meter current core to produce a line current responsive analog signal $e_i$. The induction meter electromagnet sections are mounted in a conventional fashion to a watthour meter base carrying blade terminals for mounting in mating socket terminals of a meter-mounting box. A primary winding of the voltage section is connected across two line conductors and two heavy conductor primary windings of the current section are connected in series with the line conductors by connection to the blade terminals. Secondaries of the voltage and current sections produce voltage and current analog signals responsive to the electric energy quantity flowing in the line conductors. The voltage and current analog signals are applied to an associated AC energy measuring circuit mounted to the meter frame. The frame also carries the meter electromagnet sections so that the complete watthour meter device includes a conventional meter housing including a cupshaped cover mounted to the meter base.

In an another form of the magnetic core of the current sensing transducer, the core is formed in a layer configuration having layers of strip magnetically permeable material which are bent at spaced locations across the longitudinal axis so that the ends thereof are spaced to form a predetermined magnetic air gap. The core material is made of an oriented magnetic steel having higher initial permeabilities. Two primary windings of the core are formed for series connection with two line current conductors. A secondary winding is formed thereon for providing low level signal outputs linearly responsive to the load current variations, typically in a ratio of one to four hundred. The layered core construction is preferably formed by strips cut from sheets of the oriented magnetic steel material having a high initial permeability.

A further form of the invention includes an air core type of mutual inductance current sensing transducer having a secondary winding carried by non-magnetic coil form and a pair of primary windings disposed substantially symmetrically to each other and to the secondary winding. The primary windings are connectable in series with the two line conductors having the wide ratios of line current variation. The secondary winding is inductively coupled through an air space to the primary winding fluxes to produce a current responsive analog signal output proportional to the sum of the time derivative of the line currents.

In a still further form of the present invention heavy current conductors of the meter are each connectable in series with separate line conductors. Straight portions of the conductors form an effective single turn primary winding portion that is surrounded by a toroidal secondary winding carried on a non-magnetic core mounted on an associated current conductor. The secondary windings are connected in series to produce a current responsive signal proportional to the sum of the time derivatives of the line currents.

Accordingly, the mutual inductance current sensing transducer of this invention produces an output signal responsive to the time derivative of a current component of an electric energy quantity to be measured which is responsive to current variations over wide ranges, such as produced by the line current variations supplied to residential customers of an electric power supplier. Such line current variations typically vary in a range of four hundred to one. The current sensing transducer is conveniently made in one embodiment as a modified form of a current electromagnet section of an induction watthour meter so as to be mountable to a watthour meter frame and housing. The current sensing transducer is also conveniently made in another embodiment with a toroidal secondary winding inductively coupled through an air space with separate or combined heavy conductors effectively forming single turn primary windings. The toroidal secondary windings are connected in series to produce the current responsive analog voltage signal when the line currents are sensed separately. A voltage sensing transducer is also mounted to the meter frame so that both transducers are connected to blade terminals for conventional attachment to mating sockets of existing metering locations. The current sensing transducer provides an output signal suitable for applying the current responsive input of a low signal level electronic measuring circuit and the transducer is arranged to be inherently substantially insensitive to extraneous magnetic flux fields or additional shielding is provided to isolate the transducer from magnetic fluxes which may tend to vary or adversely affect the accuracy of the current responsive signals applied to the associated AC electric energy measuring circuit.

The above and other features and advantages of the present invention will become apparent from the detailed description of the preferred embodiments of this invention shown in the drawings briefly described hereinafter.

BRIEF DESCRIPTION OF THE DRAWINGS

FIG. 2 is a side elevational view with parts broken away of the AC electric energy meter shown in FIG. 1;

FIG. 3 is a front cross-sectional view of FIG. 2 taken along the axis III—III and looking in the direction of the arrows;

FIG. 8 is a side sectional view of the transducer unit shown in FIG. 7; and

FIG. 9 is an electrical schematic diagram of the meter shown in FIG. 6 wherein the current transducer has the shielding arrangement shown in FIGS. 7 and 8.

DESCRIPTION OF THE PREFERRED EMBODIMENTS

Figure 1:
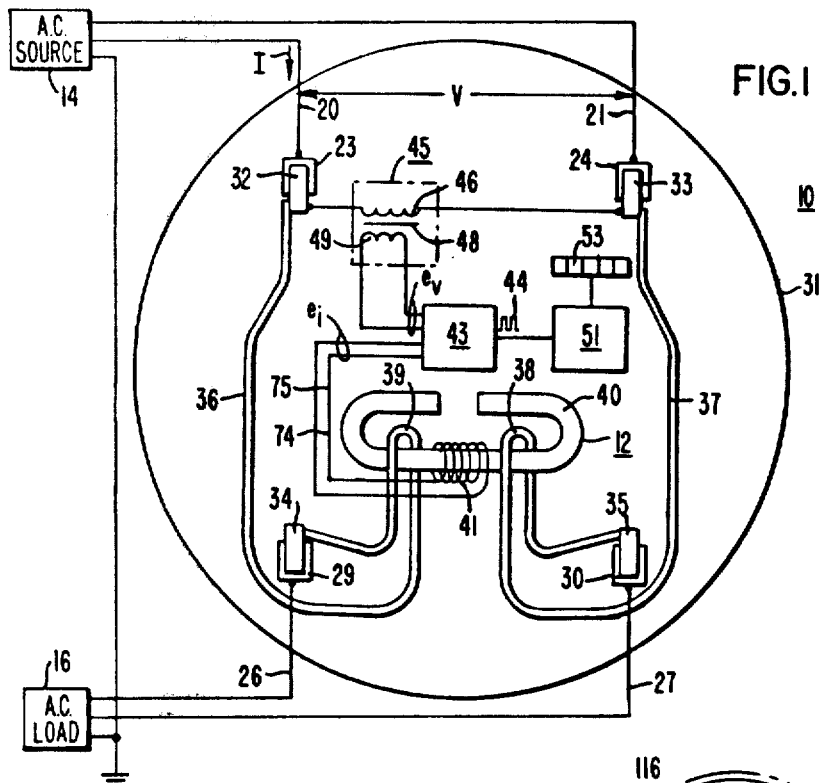
FIG. 1 is a diagrammatic view including an electrical circuit diagram of an AC electric energy meter including a mutual inductance current sensing transducer made in accordance with the present invention.

Referring now to the drawings, and more particularly to FIG. 1, an AC electric energy or watthour meter 10 is shown including a mutual inductance current sensing transducer 12 made in accordance with the present invention. The meter 10 is illustrated in one exemplary embodiment as it is connected between a sixty Hertz source 14 of AC electrical energy and AC electric load 16. Measurement of the consumption of electric energy by the load 16 is provided by the meter 10. As is well known, the electric energy quantity to be measured in kilowatt-hours is computed from a time integral of the product of line voltage V and line current I components of electric energy. The meter 10 is intended to replace an induction watthour meter typically used by utility companies at residential customer locations. Line side hot wire conductors 20 and 21, of three wire 240/120 volts service lines, connect the voltage and current transmitted from the source 14 such as provided by a pole top distribution transformer, to meter socket terminals 23 and 24 of a meter mounting box, not shown. Load side hot wire conductors 26 and 27 connect the other socket terminals 29 and 30, respectively, to the AC electric load 16 which typically includes 120 and 240 volts electric energy consuming devices. A grounded neutral conductor 28 is typically associated with the conductors 20 and 21 and 26 and 27 when the conductors 20 and 21 include service conductors connected to the aforementioned distribution transformer of source 14 having a single phase three wire 240/120 volts secondary output. The current component I of the electric energy quantity to be measured includes two currents $i_1$ and $i_2$ flowing separately in the power line conductors 20 and 21. The four socket terminals are of a conventional jaw-type typically provided in a meter-mounting box for receiving and connecting an induction type watthour meter between the source 14 and load 16.

The meter 10 includes a housing 31 shown in FIGS. 2 and 3 conventionally used for induction type watthour meters. At least four blade terminals 32, 33, 34 and 35 are carried by the housing 31 for mating with the socket terminals 23, 24, 29 and 30, respectively. Large current carrying conductors 36 and 37 of the meter 10 provide series connections between the separate pairs of terminals 32 and 34, and 33 and 35, respectively, as shown in FIG. 1, to connect the source 14 to the load 16. These connections are used for conventional three wire single phase service from a typical power line subdistribution network; however, the present invention is not limited to the particular line and load circuits described and, for example, is equally usable with a two wire service where only one hot line conductor rather than two hot line conductors are sensed. By way of example and not limitation, the voltage component V can have conventional levels of 120 volts for two wire metering or 240 volts for three wire metering. Since in a three wire system 120 volt loads of the load 16 are connected between one hot line and the grounded neutral and 240 volt loads of the load 16 are connected across the two lines 20 and 21, the currents of 120 volt loads pass through only one of the two meter conductors 36 or 37 and the current of a 240 volt load passes through both conductors 36 and 37. Unbalanced connections of the 120 volts loads cause different values of current to flow through the meter conductors 36 and 37. The watthour energy computation in the measuring circuit are consistently proportional since a voltage transducer, described below, senses the 240 volts across conductors 20 and 21 as the currents of 120 volt loads pass once through the meter and the currents of 240 volt loads pass twice in adding relationship through the meter. The current through each of the meter conductors 36 and 37 has typical variations to be linearly sensed between one-half and 200 amperes when applied to the load 16 having different load impedance values to produce the current variations. The meter 10 provides energy metering without altering the meter mounting boxes so as to be interconnected with the line and load conductors in the equivalent manner that a detachable single phase two/three wire type induction watthour meter is connected.

The current sensing transducer 12, described further hereinbelow, includes single loop or coil conductor portions 38 and 39 of the conductors 36 and 37, respectively, partially encircling a magnetic permeable core 40. The conductor portions 38 and 39 effectively form single turn primary windings of the transducer 12 inductively coupled to the core 40 so that varying magnetic flux flows therein as the currents pass through the conductors 36 and 37. The magnetic core 40 is open having a substantial air space or air gap included in the magnetic flux path passing through the core and between the ends thereof. A secondary output winding 41 is formed by a single coil wound in close inductively coupled relationship with the core 40 to produce the sensed current responsive analog signal $e_i$. The electromotive force induced therein provides the signal $e_i$ proportional to the rate of change of the current component or proportional to the sum of the derivatives with respect to time of the line currents (or $di/dt$) through both conductors 36 and 37. Thus in the transducer 12, the signal $e_i$ is developed by the electromotive forces induced in the winding 41 by the magnetic fluxes produced by the two line currents $i_1$ and $i_2$ applied to the primary winding portions 38 and 39.

An electronic AC electric energy measuring circuit 43 receives the signal $e_i$ and also a voltage responsive analog signal $e_v$ from a voltage sensing transducer 45. A potential transformer forms the transducer 45 wherein a primary winding 46 is wound on a laminated magnetic core 48 and is connected across the blade terminals 32 and 33 to be responsive to the line voltage V thereacross. The laminated core 48 also includes a secondary winding 49 inductively coupled to the primary winding 46 for providing the voltage responsive analog signal $e_v$ to the measuring circuit 43. The analog signal $e_i$ is known to have the same frequency and an amplitude proportional to the sum of the line currents, but has a ninety electrical degrees phase shift relationship thereto due to the mathematical derivative function included in the mutual inductance characteristics of the mutual inductance transducer 12. The output $e_v$ of the voltage transducer 45 is proportional in amplitude and equal in frequency and phase relationship of the line voltage V. Thus, the signals $e_v$ and $e_i$ are representative of the voltage and current components, respectively, of the AC electric energy to be measured by the meter 10.

Effectively, the AC electric energy measuring circuit 43 provides electric energy responsive pulse rate signal as disclosed and claimed in U.S. Pat. application Ser.

No. 923,530 filed July 11, 1978 and assigned to the assignee of this invention. Pulse signals 44 from the circuit 43 are each representative of a quantized amount of alternating current electric energy consumed by the AC electric load 16. The pulse values are totalized or accumulated to provide cumulative readings of electric energy consumption in watthours.

The current responsive analog signal $e_i$, being responsive to $di/dt$, provides a signal which is particularly useful in the AC electric energy measuring circuit disclosed and claimed in the aforementioned U.S. Pat. application Ser. No. 923,530. In operation, a common integrating circuit in the circuit 43 derives the current responsive analog signal $e_i$ proportional to the current component and a modulating signal to produce pulse width modulated signals having a duty cycle proportional to the sensed current. The pulse width modulated signal is applied to a time division multiplier circuit, also receiving the voltage component responsive analog signal $e_v$ to produce pulses having quantized values of measured electric energy in watthours. The analog signal $e_i$ may also be applied to an electronic integrating circuit to derive an analog signal directly proportional to and in phase with the current, rather than directly using a time derivative thereof, for use in other known time division multiplier, quarter square, digital processing with analog-to-digital conversion or other types of known electric energy measuring circuits. Also, the pulse signals from the circuit 43 may be applied to a programmable time-of-day type of electronic metering circuit 51, as disclosed in U.S. Pat. applications Ser. Nos. 891,996 and 891,997, filed Mar. 31, 1978, both assigned to the assignee of this invention. As disclosed in the aforementioned applications, an electronic digital readout display 53 provides numerical readouts of time-related parameters of an electric energy quantity to be measured.

FIGS. 2 and 3 illustrate a watthour meter housing 31 of a type used for induction watthour meters having a base 56, shown in FIG. 2, carrying the blade terminals 32, 33, 34 and 35 so that they extend from the rear thereof. A watthour meter cup-shaped cover 58 is carried by the outer periphery of the base 56 and provides a protected, enclosed space 60 forward of the front part of the base 56. A meter frame 61 carried on the front part of the base 56 is provided to carry the measuring parts of the meter 10. The current sensing transducer 12 and voltage sensing transducer 45 are carried on the frame in substantially the same manner that corresponding induction watthour meter electromagnet current and voltage sections are supported thereon. The current sensing and voltage sensing transducers 12 and 45 are connected to the blade terminals 32, 33, 34 and 35 as described and shown in FIG. 1, and also shown in FIGS. 2 and 3. A plurality of circuit boards 63, 64, 65 and 66, shown in FIG. 2, carry the electronic components of the circuits 43 and 51 and also carry the digital readout display 53 and optical shield 68 forming part of an optical link associated with the circuit 51 as described in the aforementioned application Ser. No. 891,997. Three secondary output conductors 70, 71 and 72 from the secondary winding 48 of the voltage transducer 45 apply the voltage responsive analog signal $e_v$ to the AC electric energy measuring circuit 43. Two conductors can provide the output signal $e_v$ depending upon the input circuit requirements. The second output conductors 74 and 75 from the secondary winding 41 of the current transducer 12 apply the current responsive analog signal $e_i$ to the measuring circuit 43.

Referring now in further detail to the mutual inductance current sensing transducer 12 of this invention shown in FIGS. 2 and 3, the laminated magnetically permeable core 40 is generally U-shaped and similar to that used in the current electromagnet assembly of an induction watthour meter type D4S available from Westinghouse Electric Corp., Meter and Low Voltage Instrument Transformer Division, Raleigh, NC. The large conductors 36 and 37 and primary winding portions 38 and 39 thereof are also the same as used in the aforementioned meter electromagnet section. The solid copper conductors 36 have a diameter approximately 0.23 inch (0.58 cm), or about one quarter inch diameter and are known to have very low impedances approximately a few hundred microhms or less.

Magnetic shunt bars 76 are mounted across an air gap space 78 between the ends of the core 40 with the bars extending along both sides of the core 40. The shunt bars are formed by plural magnetic strips separated by nonmagnetic spacer strips to form a compensation arrangement to improve the linear response of the transducer 12 at low values of line current. The magnetic characteristics of the magnetic shunt bars 76 are such as to saturate at higher magnetic flux values due to higher line currents while providing low reluctance flux paths across the air gap 78 at low values of magnetic flux produced by low values of line currents. The shunt bars 76 have high permeability relative to air at low flux values but still have substantially less permeability than the core 40. The generally constant high reluctance effects of the air gap 78 are reduced by the shunts 76 at low flux densities occurring at low line current values. Effectively, the shunts vary the air gap reluctance inversely with the non-linear permeability characteristics of the core 40. The air gap effect remains present throughout the measured line current ranges so that the core 40 does not magnetically saturate. It is believed that the initial permeability characteristic $\mu_o$ and the non-linear characteristics of the permeability at low magnet flux levels in the magnetization or saturation curves of the magnetic material of core 40 substantially account for the non-linearity in the increasing induced flux produced by increases in the line current. The shunt bars 76 compensate for the non-linearity by operating in the nonsaturated characteristic range thereof at low magnet flux and low current values while saturating at higher flux values when the core permeability characteristics are more linear. Thus, the shunts 76 are effective at low current values to increase magnetic coupling in the air space between the core ends by magnetically decreasing the reluctance of the air gap 78 or decreasing the effective length of the air gap.

The secondary winding 41 of the transducer 12 includes approximately three hundred turns of small diameter wire having #36 wire gauge size in one exemplary embodiment wound on the center leg of the core 40 opposite the air gap 78 so as to produce low voltage, voltage responsive analog signals $e_v$ capable of being applied to solid state electronic components of the measuring circuit 43. The mutual inductance current transducer of this invention has the secondary winding thereof providing very low levels of current flow when connected to a very high impedance circuit input in series with the secondary winding 41. In comparison conventional current instrument transformers use closed or continuous magnetic cores with minimum or negligible air gaps therein. The current instrument transformers must have very low impedance secondary loads connected thereto and the secondary outputs are current signals proportional and in phase with a primary current. The current responsive analog signal $e_i$ has a typical maximum value in the order of 5 volts and a minimum voltage in the order of 1.010 volt corresponding to line current variations occurring concurrently in the meter conductors 36 and 37 between 200 amperes and one-half ampere. The output signal $e_i$ from the secondary winding terminal conductors 74 and 75 is connectable to the relatively high impedance presented by the input of a measuring circuit, by example and not limitation, 50,000 to 100,000 ohms or higher since the current transducer 12 is of the mutual inductance type.

For purposes of reviewing the principles of the present invention, it is noted that the analog signal $e_i$ is equal to the constant of mutual inductance M, between the circuit of the primary winding conductive portions 38 and 39 and the secondary winding 41, multiplied times the derivative with respect to time of the line currents through the primary windings. Thus, $e_i$ is equal to M di/dt or is proportional to di/dt. It is to be understood that the term di/dt used herein is equal to the sum of the derivative with respect to time of the two line current components or $di_1/dt$ equals $di_2/dt$ plus $di_2/dt$ or $d(i_1+i_2)/dt$ where $i_1$ and $i_2$ are the two current values of the current component I of the electric energy to be computed and flowing in the meter conductors 36 and 37, respectively. It is known that an electromotive force e is induced into one circuit (secondary) by a change in current in the other circuit (primary) when the two circuits are close to each other. The coefficient or constant of mutual inductance M between the circuits is dependent upon the magnetic coupling of the primary and secondary coil circuits and these characteristics are described in *Physics* by Erich Hausmann and E. P. Slack published by D. Van Nostrand Co. Inc., New York, N.Y., second edition, 1939, at pp. 435–439. As described at page 438, the mutual inductance M of two neighboring coils having individual inductances $L_1$ and $L_2$ is equal to $M = k\sqrt{L_1 \times L_2}$ where k is a measure of the closeness of coupling and k is equal to one if there is complete flux coupling and no leakage. The mutual inductance is greatly increased when the coils are placed on a common magnetically permeable rod or core such as the magnetic core 40. However, the mutual inductance is not always a constant value, for reasons discussed hereinabove, causing slight changes in the proportionality in the magnetic flux in the core for a given change in current.

Generally, when the two coil windings of a mutual inductance transducer are coupled through an air space mutually surrounding the windings so they are of the so-called air core type, described further in connection with the descriptions of FIGS. 5 through 8, the coefficient of mutual inductance M will be dependent upon the number of turns in the primary and secondary windings, the area and shape of the windings, and the relative positioning of the windings. In the transducers disclosed herein there is either one or two primary windings linking the same or different secondary windings so that the voltage induced in the secondary is either proportional to one or the sum fluxes of the two primary currents or $di_1/dt + di_2/dt$ as noted above. The single or two secondary windings of each transducer described herein, produce a signal $e_i$ proportional to either one or the sum of the line currents applied to the transducers.

The use of a soft magnetic iron core, such as the core 40, provides a confined and improved flux coupling path for the flux linkages coupling the windings so that relative positioning of the windings is less critical, but the mutual inductance is dependent upon the magnetic core characteristics.

Magnetic and electrostatic shielding is often desirable for air core mutual inductance transducers, as described further hereinbelow. Magnetic and electrostatic shielding is required to avoid the effects of extraneous magnetic fields and the sixty Hertz or higher frequency signals. Such shielding is not generally required for the magnetic core type of transducer, such as transducer 12, however, this type of transducer is dependent upon the permeability of conventionally available magnetic materials and the effects of the air gap space especially when the line current magentic fluxes are variable over wide ranges, such as in a ratio of one to four hundred. The use of the aforementioned shunt bars 76 aids in the compensation for non-linearities at low current values as noted hereinabove. Another improvement for compensation of the non-linear characteristics of the magnetic core mutual inductance transducer is described hereinbelow in connection with the description of FIG. 4. The above-noted Application Ser. No. 923,530 describes a circuit technique for further compensating for non-linearities in the output signal $e_i$ using electronic circuit techniques.

Figure 4:
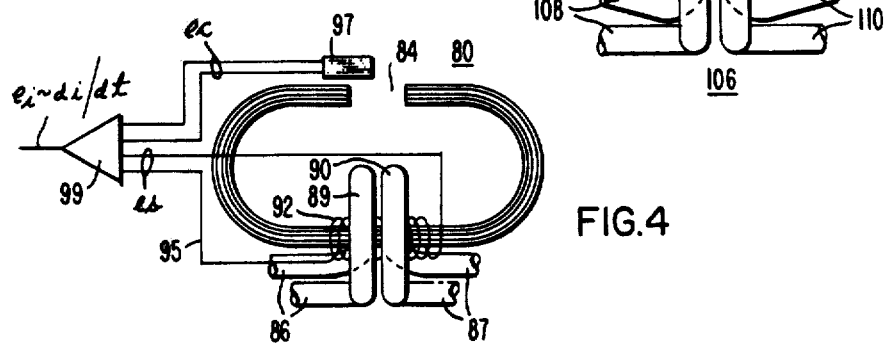
FIG. 4 is a front elevational view of an alternative embodiment of the current sensing transducer shown in FIGS. 1, 2 and 3 including an electric circuit diagram for connection to a compensation arrangement included therein.

Referring now to FIG. 4, there is shown an alternative mutual inductance current sensing transducer 80 intended to replace the transducer 12 shown in FIGS. 1, 2 and 3. The transducer 80 is formed by a layered core 82 utilizing strips of permeable magnetic material, preferably being an oriented magnetic steel material having a high coefficient of initial permeability $\mu_0$ to improve the low current produced magnetic flux level linear response of such current sensing transducers. The laminated magnetic material of induction watthour meter current cores such as illustrated in FIGS. 2 and 3 is a less expensive unoriented magnetic material. The layers of the core 82 are bent across the length or longitudinal axis thereof to form the general C-shaped configuration shown in FIG. 4 defining an air gap 84. Current conductors 86 and 87 have integral portions thereof preferably forming a single turn loop configuration to form primary windings 89 and 90 corresponding to the manner in which conductors 36 and 37 are formed with associated single turn primary winding portions described above for the transducer 12. The secondary winding 92 corresponds to the winding 41 so as to have secondary output terminal conductors 94 and 95 for producing a current responsive analog signal $e_s$.

The transducer 80 shown in FIG. 4 further includes another compensation arrangement also usable with the transducer 12 to improve the linear response thereof at low current flux producing levels. A pick-up magnetic coil 97, preferably formed on a bobbin, is positioned adjacent the air gap space 84 so as to be responsive to the stray flux associated with the air gap. Such stray air gap magnetic flux is often non-linearly responsive to the levels of main flux in the core 82 and through the air gap 84 and, therefore, not linearly proportional to the primary winding current. The stray or leakage flux is higher in proportion to the main core flux at low levels of current than at higher levels of the current. This provides an induced electromotive force and output voltage from the pick-up coil 97 that is more proportionally responsive to the low levels of the magnetic flux of the currents than at the higher levels thereof. Since the voltage induced into the secondary winding 92 is less responsive at low current or flux levels and the voltage induced in the coil 97 is proportionally more responsive, the output $e_c$ of the coil 97 and the output $e_s$ of the winding 92 are both applied to a summing amplifier circuit 99 in a compensating relationship. The output of the amplifier 99 produces a compensated and more linearly proportional current responsive analog signal $e_i$ proportional to the time derivative of the sum of the line currents of di/dt. The output of the amplifier 99 may be applied to an electric energy measuring circuit, such as 43, to produce the current responsive signal $e_i$ for use in computation of the electric energy quantity to be measured, as noted for receiving the output of the winding 41 hereinabove.

Figure 5:
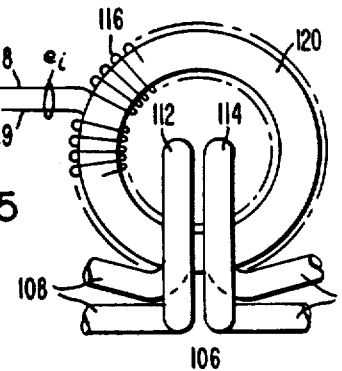
FIG. 5 is a front elevational view of a further alternative mutual inductance current sensing transducer of the air core type for replacing the transducer shown in FIGS. 1, 2 and 3.

Referring now to further embodiments of the present invention, the FIGS. 5, 6, 7 and 8 illustrate mutual inductance current sensing transducers wherein inductive coupling between the transducers is provided exclusively through an air space or spacing having the equivalent permeability of air and referred to as an air core type. FIG. 5 illustrates one air core mutual inductance current sensing transducer 106, which is not to scale, made in accordance with the present invention. FIGS. 6, 7, 8 and 9 illustrate another and two-part air core mutual inductance current sensing transducer 107 also made in accordance with the present invention.

In FIG. 5, two primary current conductors 108 and 110 are included in the transducer 106 corresponding to current conductors 36 and in 37 in the transducer 12 shown in FIGS. 1 and 3. Symmetrical flux adding single turn primary winding conductor portions 112 and 114 are included in the conductors 108 and 110, respectively. A secondary winding 116 has output terminal lead conductors 118 and 119, corresponding to terminal lead conductors 74 and 75 of winding 41, and is wound on a non-magnetic core form 120 having a permeability substantially equal to air. The analog signal $e_i$, proportional to the time derivative of the sum of the line currents, as described hereinabove, is produced at the conductors 118 and 119. It is especially desirable that the primary winding or coil conductor portions 112 and 114 have mirror image like symmetrical relationships to each other and to the secondary winding 116. The primary windings 112 and 114 preferably extend to the center of the ring defined by the secondary winding 116 so that winding 116 extends through the center of the windings 112 and 114. The secondary winding 116 is symmetrically and evenly disposed about the coil form 120. The aforementioned symmetrical alignment of the windings is substantially less sensitive to outside or extraneous magnetic fields whose effects are cancelled by the symmetrical arrangement.

In one preferred form of the transducer 106, the secondary winding 116 has 1950 turns or almost two thousand turns, a diameter of approximately 2 inches (5.1 cm), and each outer winding has a dimension of approximately ¼ inch by ½ inch (0.64 cm by 1.27 cm) and produces an $e_i$ signal of 403 millivolts for line currents $i_1$ and $i_2$ of 200 amperes each and 1.05 millivolts for line currents of one-half ampere each.

Figure 6:
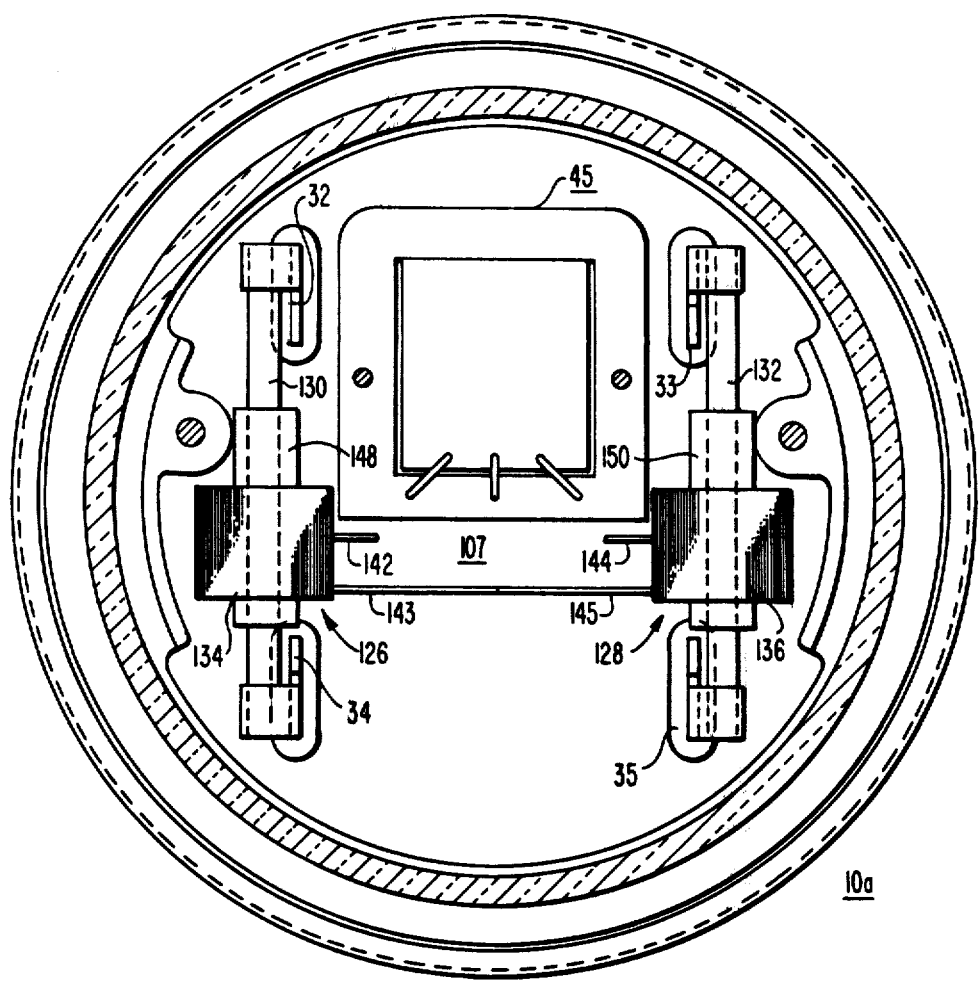
FIG. 6 is a front view with parts removed of another form of an AC electric energy meter made in accordance with this invention including a still further alternative embodiment of the mutual inductance current sensing transducer shown in FIG. 1.
Figure 7:
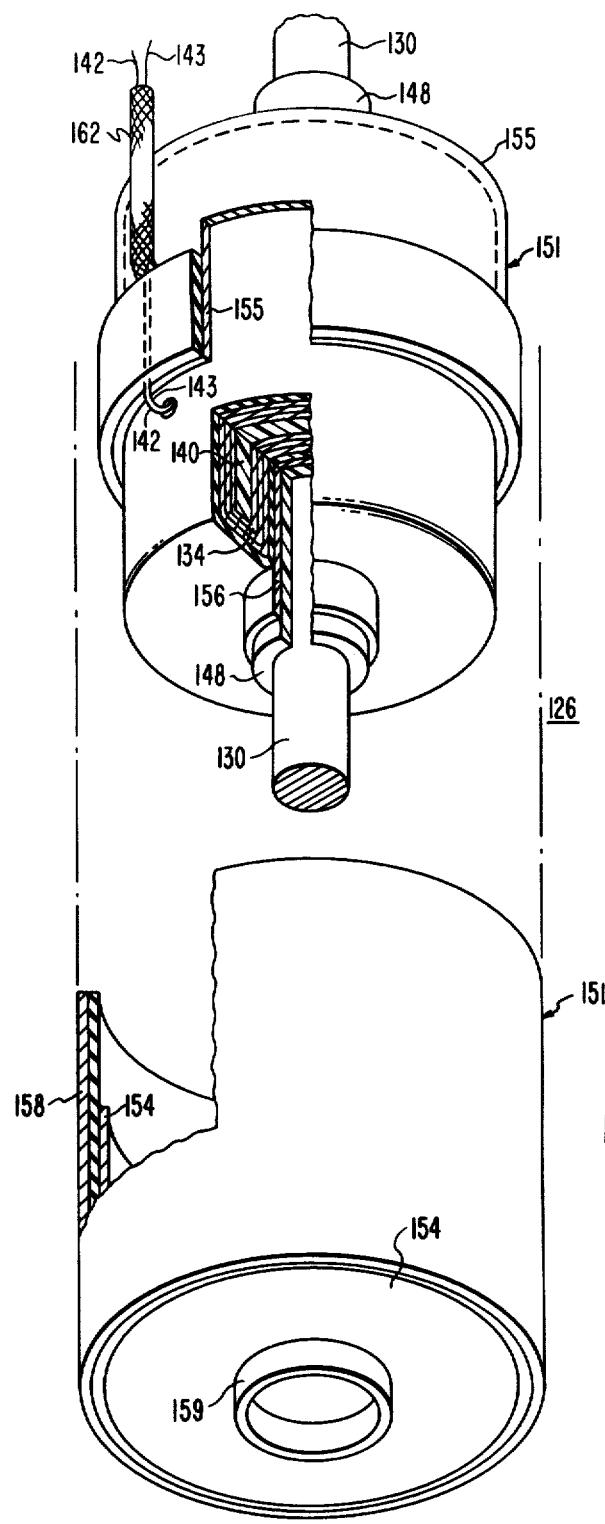
FIG. 7 is a perspective view with parts separated from one of two separate units of the mutual inductance current sensing transducer shown in FIG. 6 and further including a shielding arrangement.

Referring now to the mutual inductance current transducer 107 shown in FIG. 6, two separate and identical transducer units 126 and 128 are mounted in a meter 10a substantially identical to meter 10 excet that the transducer 107 replaces the transducer 12. The transducers 126 and 128 are shown in FIG. 6 without shielding arrangements which may be provided as shown in FIGS. 7 and 8 and described hereinbelow. A pair of straight heavy primary conductors 130 and 132 replace the conductors 36 and 37, respectively, and are similarly connected in series between the meter blade terminals 32 and 34, and 33 and 35. The distance between each pair of vertically aligned blades is 2⅞ inch (7.32 cm) in the aforementioned type D4 watthour meter and this spacing is one limiting space factor for the transducer 107. The conductors 130 and 132 are made of the same high current carrying capacity approximately ¼ inch diameter heavy conductor material as are the conductors 36 and 37. Each of the transducer units 126 and 128 includes identical toroidal coil secondary windings 134 and 136, respectively, and each acts as an independent transducer unit or element for separately sensing the currents of conductors 130 and 132.

A perspective view of the assembly of the transducer unit 126 with toroidal winding 134 is shown in FIG. 7 with parts broken away and in the cross-sectional view of FIG. 8. The windings 134 and 136 are wound on a nonmagnetic plastic hollow cylindrical coil form or bobbin 140, having effectively the same permeability as air. In one form, the windings 134 and 136 each include approximately 1500 turns of wire having a wire size approximately 0.004 inch (0.01 cm) diameter. In another form, approximately 300 turns of wire having a diameter of about 0.010 provides essentially the same size and performance in each of the windings 134 and 136. The average size of the coil turns in each of the toroidal windings 134 and 136 are approximately one inch (2.54 cm) by 0.25 inch (0.64 cm) to provide the rectangular cross section of each half of the toroidal windings. The longer length of each winding cross section is substantially parallel to the associated primary conductor and can vary between approximately ¾ and 2 inches (1.9 to 5.1 cm). The inner diameters of the windings are mounted as close as practical to the primary conductors so that preferably the inner diameter is about twice that of the primary conductor and the outer diameter is about twice the inner diameter. Accordingly, in the preferred embodiments, the inner diameter is about ½ inch (1.3 cm) and the outer diameter is about one inch (2.54 cm).

The terminal lead conductors 142 and 143 of winding 134 and 144 and 145 of the winding 136 are series connected, as shown in FIG. 6, in voltage summing relationship. The terminal conductors 142 and 144 develop the current responsive analog signal $e_i$ corresponding to the output of the terminal conductors 74 and 75 of winding 41 in FIG. 1. The inner diameters of the windings 134 and 136 are carried on plastic cylindrical sleeves 148 and 150 mounted on the conductors 130 and 132, respectively. Thus, the windings 134 and 136 encircle or surround the conductors 130 and 132 at portions thereof effectively defining single turn primary windings since the primary conducters enter and exit from the winding centers only once. The magnetic fluxes developed by currents in the primary conductors 130 and 132 pass through the effective air core spaces mutually including the conductor 130 and winding 134 and the conductor 132 and winding 136 and passing electromagnetic fluxes for inducing voltages proportional to the rate of change of the currents in the conductors 130 and 132.

To protect the transducer units 126 and 128 of the transducer 107 from extraneous electrostatic and/or magnetic fields, shielding arrangements 151 and 152 are shown schematically in FIG. 9 as they are provided for each unit 126 and 128 respectively. The FIGS. 7 and 8 illustrate one preferred form of the shielding arrangement 151 for the transducer unit 126, and it is to be understood that the substantially identical arrangement 152 is provided with like parts for the transducer unit 128. The electrical schematic diagram of FIG. 9 further illustrates the current transducer 107 including the shielded units 126 and 128 and a modified shielded voltage sensing transducer 45a including an additional secondary winding 49a to provide a power supply input to the measuring circuit 43. The shielding arrangement 151 shown in FIGS. 7 and 8 includes an outer assembly having two cup-shaped parts 154 and 155 and an inner shield part 156. The inner part 156 of the arrangements 151 and 152 includes a thin layer of conductive material such as a copper sheet material formed as a sleeve mounted on the plastic sleeves 148 and 150. The part 156 for the arrangements 151 and 152 covers the peripheries of the inner diameters of the winding 134 and winding 136 thereof to shield the space between the windings and the associated conductors 130 and 132, respectively. The parts 154, 155 and 156 are grounded as described further hereinbelow so that extraneous high frequency signals are shunted to ground rather than being coupled from the conductors 130 and 132 to windings 134 and 136 without affecting the magnetic flux or mutual inductance coupling therebetween. The outer parts 154 and 155 can provide both magnetic and electrostatic shielding when made of a suitable soft magnetic material also having high conductivity. Alternatively, the parts 154 and 155 can be made of a highly conductive substantially nonmagnetic material such as the same or equivalent copper sheet material forming the part 156. In the alternate shielding arrangement a further soft magnetic sleeve part 158, shown in FIGS. 7 and 8, is mounted around the outer peripheries of the parts 154 and 155 to magnetically shield the periphery of the outer diameters of the windings 134 and 136.

The parts 154 and 155 each include a circular hole opening surrounded by hub portions 159 and 160 in the outer ends thereof for receiving the ends of the plastic sleeves 148 or 150 and making electrical conductive contact with the inner part 156. Preferably, the outer extending hub portions of the parts 154 and 155 are also soldered to the ends of inner part 156 to provide solid electrical contact. The open or inner end of one part, such as part 154, has a larger diameter that that of the other part, such as part 155, so that the larger part 154 telescopically receives the smaller part 155 in mutual overlapping relationship. Thus, the parts 154, 155, and 156 provide a complete shielded cover over all sides of the windings 134 and 136 for the transducer units 126 and 128. Layers of insulating material, such as provided by an insulation paint or an insulation tape, are provided around all sides of the windings 134 and 136 to prevent electrical contact between the winding wire conductors and the conductive parts 154, 155, and 156. A further layer of insulation material is provided between the outer overlapping surfaces formed around the outer diameter of the cup-shaped part 154 and inner diameter of the cup-shaped part 155. This insulated relationship prevents the parts 154, 155, and 156 from providing a continuous electrical path circumscribing the paths of the winding turns. This avoids a short circuit path parallel to the winding turns. The overlapping space between parts 154 and 155 also receives the pairs of lead wire conductors 142 and 143 from winding 134 and lead wire conductors 145 and 146 from winding 136 which are attached to the associated winding wire ends. The pairs of conductors 142 and 143 and 145 and 146 are provided in two wire shielded coaxial cables 162 and 164, respectively, shown in FIGS. 8 and 9. The outer conductive sheath material provides an electrostatic shield part for each of the cables which is conductively attached by soldering to one of the parts 154 and 155. The outer shields of cables 162 and 164 are shown in FIG. 9 connected together and further connected to a single source of ground potential 166 to provide a common ground connection to the shielding arrangements 151 and 152 each including the parts 154, 155, and 156. The ground source 166 is preferably provided at a metal enclosure provided for the measuring circuit 43 which, in turn, is connected to an earth-ground connection available at the meter mounting box having the socket terminals 23, 24, 29 and 30 shown in FIG. 1. It has been found important that the shield parts of the arrangements 151 and 152 are connected together and to the ground source 166 rather than separately connected to source 166. The shielding arrangement 168 of the voltage transducer 45a is also connected to the ground source 166.

The magnetic sleeve part 158 shown in FIGS. 7 and 8 is provided when the parts 151 and 152 are not of a magnetic as well as conductive material as described hereinabove. The magnetic part 158 is mounted in an insulated relationship over the outer peripheries of the parts 154 and 155 and is spaced therefrom by an insulating layer of the aforementioned insulation paint or tape material. Thus, the windings 134 and 136 are shielded from the effects of stray magnetic fields, as well as electrostatic fields, which can produce errors in the current responsive analog signals $e_i$. Satisfactory operation in the use of the transducer 107 has been found with only an electrostatic shielding arrangement wherein the parts 154, 155 and 156 are used when formed of the aforementioned copper sheet material and no magnetic shield part 158 is used.

The electrical schematic diagram of FIG. 9 illustrates the electrical connections of the voltage sensing transducer 45a and current sensing transducer 107 of the meter 10a of FIG. 6, as noted hereinabove. The shielding arrangements 151 and 152 including parts 154, 155 and 156 provide the shielding of windings 134 and 136 as described above in one of the alternative forms. The output $e_v$ of the transducer 45a and output $e_i$ of the two transducer sections 126 and 128 are applied to the electronic AC electric energy measuring circuit 43 as described for the meter 10 shown in FIG. 1.

It will be apparent to those skilled in the art that certain alternatives and modifications of the embodiments as described hereinabove may be made without departing from the spirit and scope of this invention.

I claim:

1. An AC electric energy meter having an electronic measuring circuit processing analog signals responsive to current and voltage components of an alternating current electric energy quantity supplied by conductors of a power line distribution system and to be measured for producing electronic signals representative of quantized amounts of electric energy consumption, said meter comprising:

a housing adapted for series connection of said meter with at least two of said power line distribution system conductors carrying separate current flows of said electric energy quantity to be measured;

a voltage sensing transducer connected in parallel with said power line distribution system conductors for producing a voltage responsive analog voltage signal proportional to said voltage component;

current sensing transducer means comprising first and second current conductors each connected serially with one of said power line distribution system conductors for series connection with each of the separate current flows of said current component, each of said current conductors effectively forming a single turn primary winding for producing magnetic flux variations responsive to the magnitude and rate of changes of the separate current flow therein;

said current sensing transducer means further comprising secondary winding means comprising first and second toroidal windings each separately receiving one of said current conductors, each of said toroidal windings being wound on separate non-magnetic cores so as to include multiple turns each wound with a substantially rectangular cross section having a longer side substantially parallel to the single turn primary winding formed by said current conductors with the center openings of said toroidal windings being each mounted on separate non-magnetic cylindrical mounting sleeves carried by said current conductors so that said toroidal windings are inductively coupled to said magnetic flux variations of the associated current conductor through an effectively non-magnetic air gap space, and said toroidal windings further comprising lead wire conductors connected so that said secondary winding means produces a current responsive analog voltage signal linearly proportional to the sums of the time derivatives of the separate current flows in each of said current conductors throughout a ratio of combined current variations of at least four hundred to one with both of said voltage and current responsive analog voltage signals being effective for connection to high impedance and low level signal inputs of said electronic measuring circuit.

2. The AC electric energy meter as claimed in claim 1 wherein the lengths of the longer sides of the rectangular cross section of said winding turns of each of said toroidal windings are in the order of one inch (2.54 cm) and the outer diameters of said windings are in the order of one inch (2.54 cm).

3. The AC electric energy meter as claimed in claim 1 wherein each of said toroidal windings comprises a shielding arrangement including an electrically conductive sleeve covering the associated mounting sleeve and a pair of telescopically overlapping cup-shaped members made of an electrically conductive material surrounding the outer periphery of the associated winding with the outer ends of each pair of cup-shaped members fitting over the associated mounting sleeve in electrical contact with the conductive sleeve carried thereon and with the inner ends of each pair of cup-shaped members overlapping in mutually insulated relationship.

4. The AC electric energy meter as claimed in claim 3 comprising first and second two wire shielded cables separately connected to said first and second toroidal windings, respectively, and extending through the overlapping spaces of the associated pair of cup-shaped members of each shielding arrangement.

5. The AC electric energy meter as claimed in claim 4 wherein the conductive sleeve, the pair of cup-shaped members, and the shield material of each cable of an associated toroidal winding are connected together and with a single connection connected to a source of ground potential.

6. The AC electric energy meter as claimed in claim 3 wherein the shielding arrangement of each of said toroidal windings includes a soft magnetic cylindrical member mounted in insulated relationship over the outer peripheries of said pair of cup-shaped members so as to extend between the ends of the associated toroidal winding and provide magnetic shielding thereof.

7. An AC electric energy meter having an electronic measuring circuit processing analog signals responsive to current and voltage components of an alternating current electric energy quantity supplied by conductors of a power line distribution system and to be measured for producing electronic signals representative of quantized amounts of electric energy consumption, said meter comprising:

a housing adapted for series connection of said meter with at least two of said power line distribution system conductors carrying separate current flows of said electric energy quantity to be measured;

a voltage sensing transducer connected in parallel with said power line distribution system conductors for producing a voltage responsive analog voltage signal proportional to said voltage component;

current sensing transducer means comprising first and second current conductors each connected serially with one of said power line distribution system conductors for series connection with each of the separate line current flows of said current component, each of said current conductors effectively forming a single turn primary winding for producing magnetic flux variations responsive to the magnitude and rate of changes of the separate current flow therein;

said current sensing transducer means further comprising secondary winding means comprising first and second toroidal winding means for producing a current responsive analog voltage signal linearly proportional to the sums of the time derivatives of the separate current flows in each of said current conductors;

each of said toroidal winding means separately receiving one of said current conductors and comprising multiple turns wound on separate non-magnetic cores, said multiple turns comprising a first portion substantially parallel to said current conductor and a second portion substantially perpendicular to said current conductor, said first portion being effectively longer than said second portion;

each of said toroidal winding means having a center opening disposed about separate non-magnetic cylindrical mounting sleeves carried by said large conductors so that said toroidal winding means are inductively coupled to said magnetic flux variations of the associated current conductor through an effectively non-magnetic air gap space;

each of said voltage and current responsive analog signals being effective for connection to high impedance low level signal inputs of said electronic measuring circuit.

8. An AC electric energy meter having an electronic measuring circuit processing analog signals responsive to current and voltage components of an alternating current electric energy quantity supplied by conductors of a power line distribution system and to be measured for producing electronic signals representative of quantized amounts of electric energy consumption, said meter comprising:

a housing adapted for series connection of said meter with at least two of said power line distribution system conductors carrying separate current flows of said electric energy quantity to be measured;

a voltage sensing transducer connected in parallel with said power line distribution system conductors for producing a voltage responsive analog voltage signal proportional to said voltage component;

current sensing transducer means comprising first and second current conductors each connected serially with one of said power line distribution system conductors for series connection with each of the separate current flows of said current component, each of said current conductors effectively forming a primary winding for producing magnetic flux variations responsive to the magnitude and rate of changes of the separate current flow therein;

said current sensing transducer means further comprising secondary winding means comprising a plurality of toroidal windings each separately receiving one of said current conductors, each of said toroidal windings being wound on separate non-magnetic cores so as to include multiple turns each wound with a substantially rectangular cross section having a longer side substantially parallel to the primary winding formed by said current conductors with the center openings of said toroidal windings being each mounted on separate non-magnetic cylindrical mounting sleeves carried by said current conductors so that said toroidal windings are inductively coupled to said magnetic flux variations of the associated current conductor through an effectively non-magnetic air gap space, and said toroidal windings further comprising lead wire conductors connected so that said secondary winding means produces current responsive analog voltage signals linearly proportional to the time derivatives of the separate current flows in each of said current conductors throughout a ratio of combined current variations of at least four hundred to one with both of said voltage and current responsive analog voltage signals being effective for connection to high impedance and low level signal inputs of said electronic measuring circuit.

9. The AC electric energy meter as claimed in claim 8 wherein the lengths of the longer sides of the rectangular cross section of said winding turns of each of said toroidal windings are in the order of one inch (2.54 cm) and the outer diameters of said windings are in the order of one inch (2.54 cm).

10. The AC electric energy meter as claimed in claim 8 wherein each of said toroidal windings comprises a shielding arrangement including an electrically conductive sleeve covering the associated mounting sleeve and a pair of telescopically overlapping cup-shaped members made of an electrically conductive material surrounding the outer periphery of the associated winding with the outer ends of each pair of cup-shaped members fitting over the associated mounting sleeve in electrical contact with the conductive sleeve carried thereon and with the inner ends of each pair of cup-shaped members overlapping in mutually insulated relationship.

11. The AC electric energy meter as claimed in claim 10 comprising a plurality of two wire shielded cables separately connected to said toroidal windings and extending through the overlapping spaces of the associated pair of cup-shaped members of each shielding arrangement.

12. The AC electric energy meter as claimed in claim 11 wherein the conductive sleeve, the pair of cup-shaped members, and the shield material of each cable of an associated toroidal winding are connected together with a single connection connected to a source of ground potential.

13. The AC electric energy meter as claimed in claim 10 wherein the shielding arrangement of each of said toroidal windings includes a soft magnetic cylindrical member mounted in insulated relationship over the outer peripheries of said pair of cup-shaped members so as to extend between the ends of the associated toroidal winding and provide magnetic shielding thereof.

14. An AC electric energy meter having an electronic measuring circuit processing analog signals responsive to current and voltage components of an alternating current electric energy quantity supplied by conductors of a power line distribution system and to be measured for producing electronic signals representative of quantized amounts of electric energy consumption, said meter comprising:

a housing adapted for series connection of said meter with at least two of said power line distribution system conductors carrying separate current flows of said electric energy quantity to be measured;

a voltage sensing transducer connected in parallel with said power line distribution system conductors for producing a voltage responsive analog voltage signal proportional to said voltage component;

current sensing transducer means comprising a plurality of current conductors each connected serially with one of said power line distribution system conductors for series connection with each of the separate line current flows of said current component, each of said current conductors effectively forming a primary winding for producing magnetic flux variations responsive to the magnitude and rate of changes of the separate current flow therein;

said current sensing transducer means further comprising secondary winding means comprising a plurality of toroidal winding means for producing current responsive analog voltage signals linearly proportional to the time derivatives of the separate current flows in each of said current conductors;

each of said toroidal winding means separately receiving one of said current conductors and comprising multiple turns wound on separate non-magnetic cores, said multiple turns comprising a first portion substantially parallel to said current conductor and a second portion substantially perpendicular to said current conductor, said first portion being effectively longer than said second portion;

each of said toroidal winding means having a center opening disposed about separate non-magnetic cylindrical mounting sleeves carried by said current conductors so that said toroidal winding means are inductively coupled to said magnetic flux variations of the associated current conductor through an effectively non-magnetic air gap space;

each of said voltage and current responsive analog signals being effective for connection to high impedance low level signal inputs of said electronic measuring circuit.

* * * * *